United States Patent
Khan et al.

(10) Patent No.: US 8,940,556 B2
(45) Date of Patent: Jan. 27, 2015

(54) ELECTRICAL BIAS METHODS AND APPARATUS FOR PHOTOVOLTAIC DEVICE MANUFACTURE

(71) Applicant: First Solar, Inc., Perrysburg, OH (US)

(72) Inventors: Imran Khan, Perrysburg, OH (US); Markus Gloeckler, Perrysburg, OH (US); Jigish Trivedi, Perrysburg, OH (US); Thomas Truman, Toledo, OH (US)

(73) Assignee: First Solar, Inc, Perrysburg, OH (US)

( * ) Notice: Subject to any disclaimer, the term of this patent is extended or adjusted under 35 U.S.C. 154(b) by 0 days.

(21) Appl. No.: 13/748,053

(22) Filed: Jan. 23, 2013

(65) Prior Publication Data

US 2013/0146576 A1 Jun. 13, 2013

Related U.S. Application Data

(63) Continuation-in-part of application No. 13/035,594, filed on Feb. 25, 2011, now Pat. No. 8,431,427, which is a continuation-in-part of application No. 13/615,815, filed on Sep. 14, 2012.

(60) Provisional application No. 61/589,449, filed on Jan. 23, 2012, provisional application No. 61/309,064, filed on Mar. 1, 2010, provisional application No. 61/539,314, filed on Sep. 26, 2011.

(51) Int. Cl.
| | |
|---|---|
| *H01L 21/66* | (2006.01) |
| *H01L 21/00* | (2006.01) |
| *H05B 1/00* | (2006.01) |
| *H01L 31/048* | (2014.01) |
| *H01L 31/18* | (2006.01) |
| *G01R 31/40* | (2014.01) |

(52) U.S. Cl.
CPC ............. *H05B 1/00* (2013.01); *H01L 31/048* (2013.01); *H01L 31/18* (2013.01); *H02S 50/00* (2013.01); *Y02E 10/50* (2013.01)
USPC ................................ 438/14; 438/57; 438/88

(58) Field of Classification Search
None
See application file for complete search history.

(56) References Cited

U.S. PATENT DOCUMENTS

| | | | |
|---|---|---|---|
| 3,303,059 A | 2/1967 | Kerr et al. | |
| 3,436,275 A | 4/1969 | Tsao et al. | |
| 4,129,823 A | 12/1978 | van der Pool et al. | |
| 4,395,293 A * | 7/1983 | Knechtli et al. | 438/4 |
| 8,263,176 B2 * | 9/2012 | Herguth et al. | 427/74 |
| 2007/0029468 A1 | 2/2007 | Sinton et al. | |
| 2009/0127448 A1 | 5/2009 | Fuyuki | |
| 2009/0238444 A1 | 9/2009 | Su et al. | |
| 2010/0201374 A1 | 8/2010 | Vasilyev et al. | |
| 2011/0193561 A1 | 8/2011 | Capulong et al. | |
| 2011/0237021 A1 | 9/2011 | Gloeckler et al. | |
| 2013/0076380 A1 | 3/2013 | Khan et al. | |

OTHER PUBLICATIONS

Christiana Honsberg and Stuart Bowden, "Solar Cell Operation Fill Factor, PVEducation," PVEducation.org. http://www.pveducation.org/pvcdrom/solar-cell-operation/fill-factor, 2010.

(Continued)

*Primary Examiner* — Scott B Geyer
(74) *Attorney, Agent, or Firm* — Dickstein Shapiro LLP

(57) ABSTRACT

A apparatus and method for manufacturing a photovoltaic module includes components for heating the module and applying an electrical bias to the module to improve photovoltaic module performance and manufacture multiple photovoltaic modules with similar performance.

12 Claims, 10 Drawing Sheets

(56) References Cited

OTHER PUBLICATIONS

Keithley Instruments et al., "Making I-V and C-V Measurements on Solar/Photovoltaic Cells Using the Model 4200-SCS Semiconductor Characterization System." Keithley Application Note Series, No. 2876, 2007.

C. Lashway, "Photovoltaic System Testing Techniques and Results." IEEE Transactions on Energy Conversion, vol. 3, No. 3, Sep. 1988.

* cited by examiner

ELECTRICAL BIAS METHODS AND APPARATUS FOR PHOTOVOLTAIC DEVICE MANUFACTURE

CLAIMS OF PRIORITY

This application claims priority under 35 U.S.C. §119(e) to U.S. Provisional Patent Application Ser. No. 61/589,449 filed on Jan. 23, 2012, which is hereby incorporated by reference in its entirety. This application is also a continuation-in-part and claims priority to U.S. application Ser. No. 13/035,594, filed on Feb. 25, 2011, which claims priority to U.S. provisional application No. 61/309,064, filed on Mar. 1, 2010, the entirety of each of which is hereby incorporated by reference. This application is also a continuation-in-part and claims priority to U.S. application Ser. No. 13/615,815, filed on Sep. 14, 2012, which claims priority to U.S. provisional application No. 61/539,314, filed on Sep. 26, 2011, the entirety of each of which is hereby incorporated by reference.

TECHNICAL FIELD

The present invention relates to photovoltaic devices and methods for manufacturing photovoltaic devices.

BACKGROUND

A typical photovoltaic (PV) device is a PV module that can convert photo-radiation into electrical current. A typical PV module includes two conductive electrodes sandwiching a series of semiconductor layers, which provide a junction at which the photo-conversion occurs.

Photovoltaic modules, which can be patterned into a plurality of PV cells, can be formed on an optically transparent substrate. This substrate can be any suitable, transparent substrate material such as glass (including, but not limited to soda-lime glass or float glass) or polymer (sheet or plates). A first of two conductive electrodes is provided over the transparent substrate. The first conductive electrode can be a transparent conductive oxide (TCO) layer (e.g., indium tin oxide). The TCO layer can be associated with a barrier layer between it and the transparent substrate and also with a buffer layer over the TCO layer, which together provide a TCO stack that functions as the first conductive electrode. Over the first conductive electrode (buffer layer if provided), a semiconductor layer is provided. The semiconductor layer can be a bi-layer that includes a semiconductor window layer (e.g., cadmium sulfide) and a semiconductor absorber layer (e.g., cadmium telluride). Over the semiconductor layer, there is a second conductive electrode (e.g., a back contact layer), an interlayer to seal the PV module, and a back cover to provide support for the PV module, in that order.

During operation, photons pass into the semiconductor layers and are absorbed at or near the junction between the window layer and the absorber layer. This produces photo-generated electron-hole pairs, the movement of which, promoted by a built-in electric field, produces electric current that can be output from the device.

PV module performance characteristics may be evaluated based on identifying the module's short circuit current ($I_{sc}$), open circuit voltage ($V_{oc}$), fill factor (FF), or open cell resistance ($R_{oc}$) (collectively, variables). Short circuit current ($I_{sc}$) is the current through a PV device when the voltage across the PV device is zero, i.e., when a solar cell is short circuited; it relates to the generation and collection of light-generated carriers and represents the largest current that can be drawn from the PV device. Open circuit voltage ($V_{oc}$) is a value that determines the maximum voltage available from a PV device, which occurs at zero current; it is a measurement of the amount of recombination in the PV device. Fill factor (FF) is a value that determines the maximum power from a PV device and is defined as the ratio between the maximum power from the PV device and the product of $V_{oc}$ and $I_{sc}$; a higher voltage provides a higher possible FF. Open cell resistance ($R_{oc}$) is a value that determines the resistance provided from an open circuit PV device.

During manufacturing of PV modules, minor variations in process parameters may result in modules having dissimilar performance characteristics, measureable by testing and determining the above-identified performance variables. Dissimilar performance characteristics are undesirable because the design and performance of an array of PV modules may rely on each PV module performing according to product specifications. Therefore, it is desirable to manufacture PV modules that exhibit similar performance characteristics when installed in the field. Moreover, it is desirable to manufacture PV modules that maintain similar performance characteristics over the life expectancies of the PV modules. An efficient way to test and condition PV modules during and/or after manufacture is desired.

DETAILED DESCRIPTION

Figure 1:
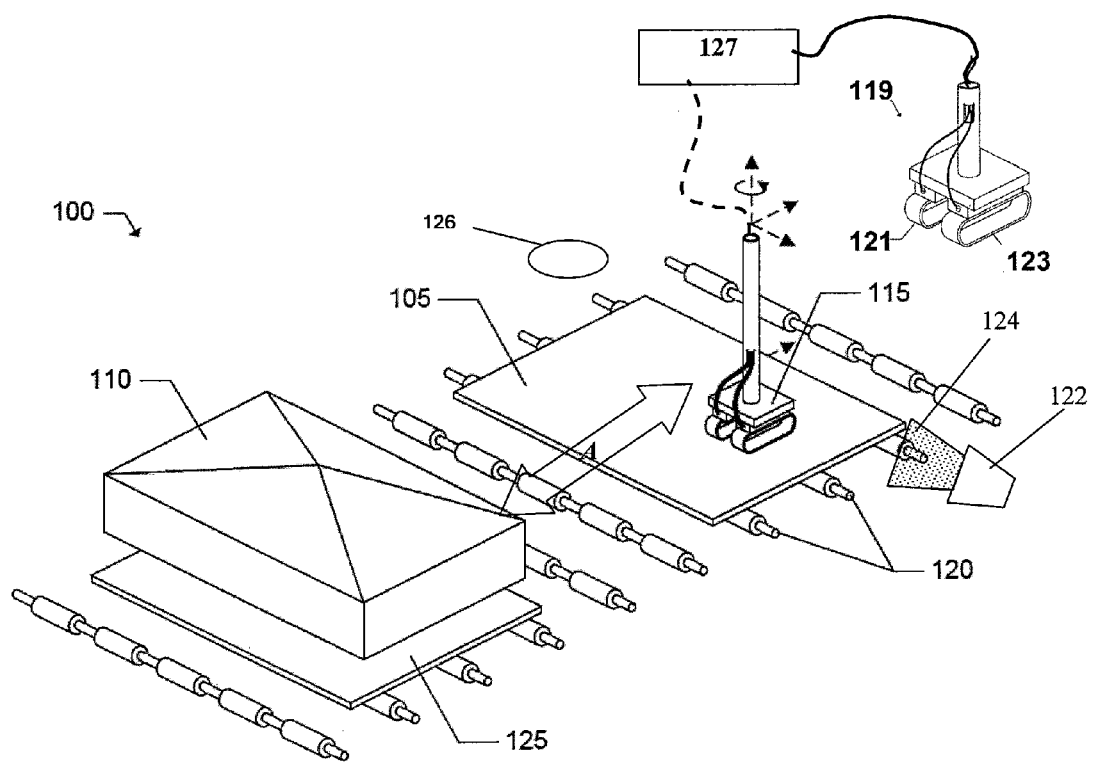
FIG. 1 is an apparatus for manufacturing a PV module.

In the following detailed description, reference is made to the accompanying drawings which form a part hereof, and in which is shown by way of illustration specific embodiments that provide a system for testing and conditioning PV modules while they are manufactured. These embodiments are described in sufficient detail to enable those skilled in the art to make and use them, and it is to be understood that structural, logical, or procedural changes may be made to the specific embodiments disclosed without departing from the spirit and scope of the invention. In the drawings, like reference numbers denote like features.

FIG. 1 shows a portion of an apparatus 100, which can be a part of a PV module 105 manufacturing line or an independent device, that can be used to apply an electrical bias and temperature conditioning (and optionally light conditioning) to a PV module 105. The various components of the apparatus 100 can include a conveyor, such as rollers 120, which can move the PV module 105 in the direction of arrow A. Alternately, instead of rollers 120, the conveyor may include a belt, chain, or any other suitable components for transporting the module 105. In addition, the apparatus 100 can include a heater 110 and a biasing tool 115. A light generator 122 can be included for applying light conditioning to the module 105 at the side thereof designed to receive light during use. As discussed further below, a method for manufacturing the photovoltaic module 105 using the apparatus 100 includes applying an electrical bias to electrodes 305, 310 (FIG. 3) of the module 105 while the module 105 is at an elevated temperature.

The conditioning of PV modules 105 using the apparatus 100 can provide them with improved reliability and performance characteristics and can provide more consistent performance within different PV module in batches. During the manufacturing process, the apparatus 100 subjects the PV module 105 to conditioning including an applied electrical bias and thermal conditions, and potentially also light application conditioning, which stress the PV modules 105 materials. The preferred electrical bias applied to an exemplary PV module 105 can be about 0.1 amps to about 25 amps and up to about 600 volts. Also, the electrical bias can be applied in the form of, e.g., constant, varied or pulsed current and/or voltage, and combinations of these variations. The preferred temperature range of the exemplary PV module 105 at which this electrical biasing takes place can be between about 85° C. and about 160° C., most preferably between about 110° C. and about 160° C. Furthermore, the electrical biasing and thermal conditioning can take place using the apparatus 100 over a preferred time of about 0-30 minutes, more preferably less than 6 minutes.

The electrical bias and thermal stress can be applied either together in dedicated association with one another or as separate steps where the biasing step takes advantage of heating that takes place during other PV module 105 processing. Regardless of when thermal stress is applied, the combined electrical bias and thermal conditioning is provided in association with one another to provide the PV module 105 with improved performance and to produce groups of PV modules having less performance variation between similarly manufactured PV modules. Such PV module 105 performance can be tested and measured as $I_{sc}$, $V_{oc}$, FF, and/or $R_{oc}$ of the PV module 105 and other PV modules.

The disclosed conditioning can be performed as standard processing, for example, for each PV module (e.g., 105, 125) fabricated on a manufacturing line, in which case the apparatus 100 would preferably be a part of the manufacturing line. Alternatively, the conditioning can be performed as an offline application, in which case the apparatus 100 may be separate from the manufacturing line. Alternatively, the conditioning can be performed in relation or responsive to specific tests of pre-conditioning performance (e.g., of $I_{sc}$, $V_{oc}$, FF, and/or $R_{oc}$) in individual PV modules (e.g., 105, 125) or groups of such PV modules. As another alternative, the conditioning can be performed in relation or responsive to PV module or batch production history if it is known that certain processing conditions or events may cause correctable performance problems in the PV modules.

The apparatus 100 can apply an electrical bias conditioning to the module 105 electrodes while the module 105 is at a preferred temperature between about 85° C. and about 160° C., most preferably between about 110° C. and about 160° C. The electrical biasing process is thermally accelerated, which means that the higher the PV module 105 temperature within the preferred range, the less time the biasing process need take. Within the most preferred temperature range of about 110° C. and about 160° C., the biasing process can take less than 6 minutes.

Figure 3:
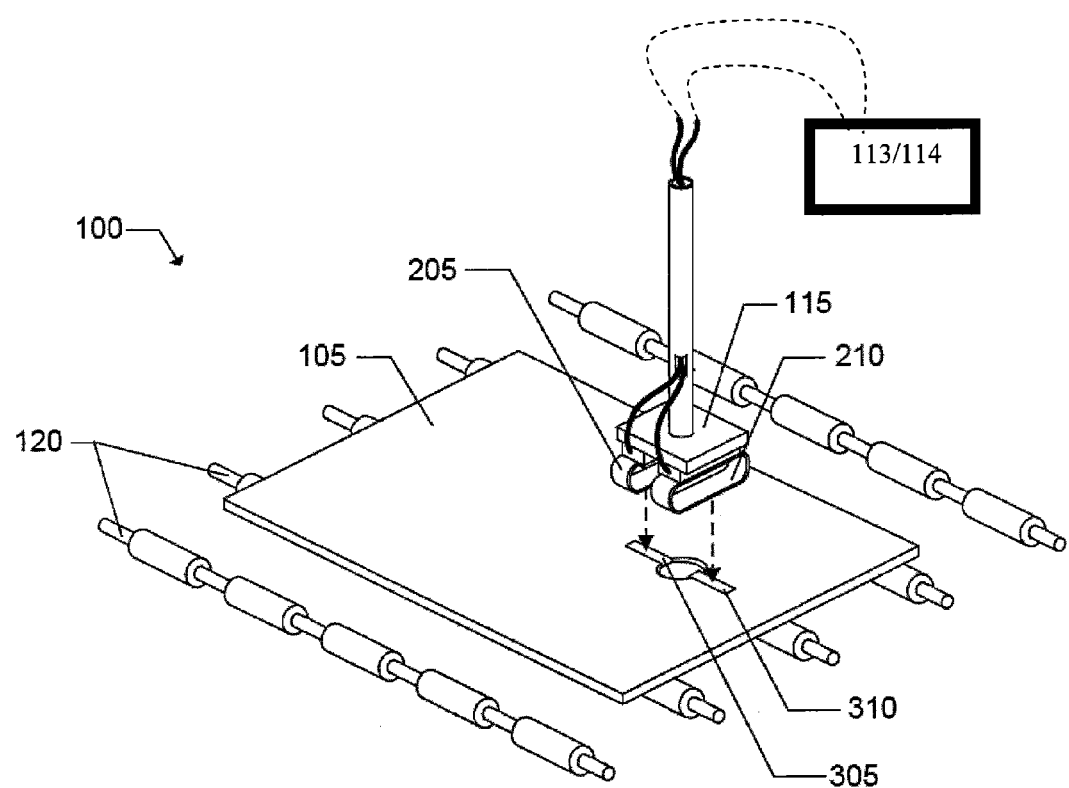
FIG. 3 is an apparatus for manufacturing a PV module.

The biasing tool 115 can be mounted proximate the conveyor of an assembly line as shown in FIGS. 1 and 3. The biasing tool 115 may be capable of translating along, or rotating about, at least one axis (X, Y, and/or Z). As a result, the biasing tool 115 can move and adjust to engage the electrodes 305, 310 of a PV module 105 supported on and transported by rollers 120 of the conveyor downstream from or between the heater 110 and/or other processing stations.

Figure 2:
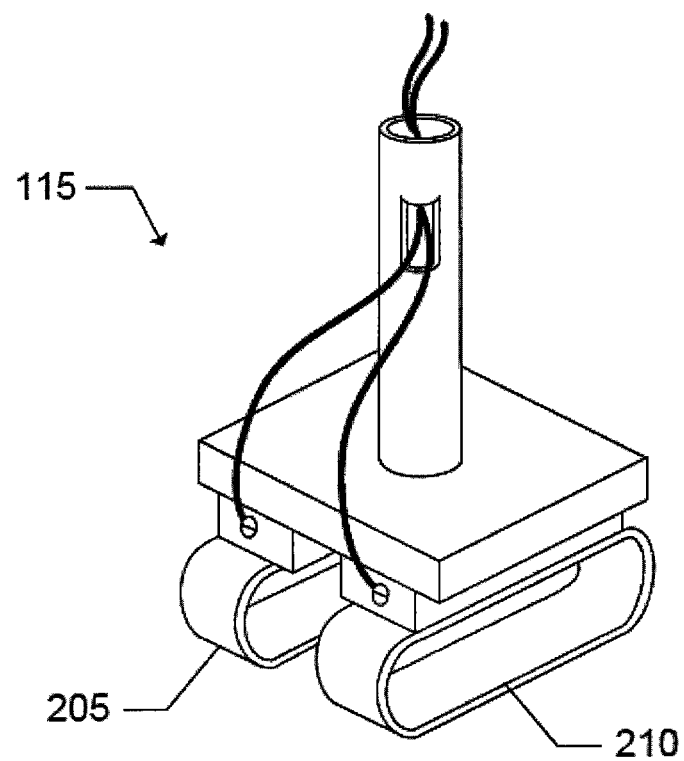
FIG. 2 is a biasing tool for applying an electrical bias to a PV module.

FIG. 2 shows in greater detail an embodiment of the biasing tool 115, which applies an electrical bias to the PV module 105 electrodes 305, 310 during conditioning. The biasing tool 115 includes a first contact 205 and a second contact 210. The first and second contacts 205, 210 are configured to contact the electrodes 305, 310 of the PV module 105, e.g., via conductive leads connected thereto that exit the PV module 105 and are accessible at its exterior. The positive electrode 305 and the negative electrode 310 are the electrical contacts from the PV module 105, which can be connected to an exterior circuit to supply the electrical output from the module 105 in the field or during testing. The first and second contacts 205, 210 of the biasing tool 115 are electrical contacts and can provide constant, varied, or pulsed current and/or voltage, or combinations of these, from a power source 113 to the electrodes 305, 310 of the PV module 105.

As shown in FIG. 3, the first and second contacts 205, 210 of the biasing tool 115 are configured to contact the positive electrode 305 and the negative electrode 310 on the PV module 105. To interface with the biasing tool 115, the PV module 105, at the desired temperature, is conveyed to a processing location proximate the biasing tool 115 by moving along the rollers 120. When the PV module 105 is in position, the tool 115 and module 105 are brought into contact with one another.

The biasing tool 115 can be configured to contact the PV module 105 during a latter stage of manufacture. Therefore, the PV module 105 may be either partially manufactured or fully manufactured when the biasing tool 115 contacts the PV module 105. For example, the biasing tool 115 may contact the electrodes 305, 310 of the PV module 105 before a back cover has been formed adjacent to the PV module 105. Alternately, formation of the back cover may be complete as shown in FIG. 3, and the biasing tool may contact the PV module 105 prior to installing a cord plate, which connects external connectors to the electrodes 305, 310 of the PV module 105.

The electrical bias applied by the biasing tool 115 to electrodes 305, 310 originates from the power source 113, which can be controlled by a processor 114 to have the biasing tool 115 output a predetermined electrical bias to the PV module 105. The power source 113 can be capable of providing a variety of electrical voltages, currents, and pulses. In some exemplary embodiments, the power source 113 provides a constant voltage, a constant current, a variable voltage, a variable current, pulses of constant current, pulses of constant voltage, or any combination thereof.

Figure 4:
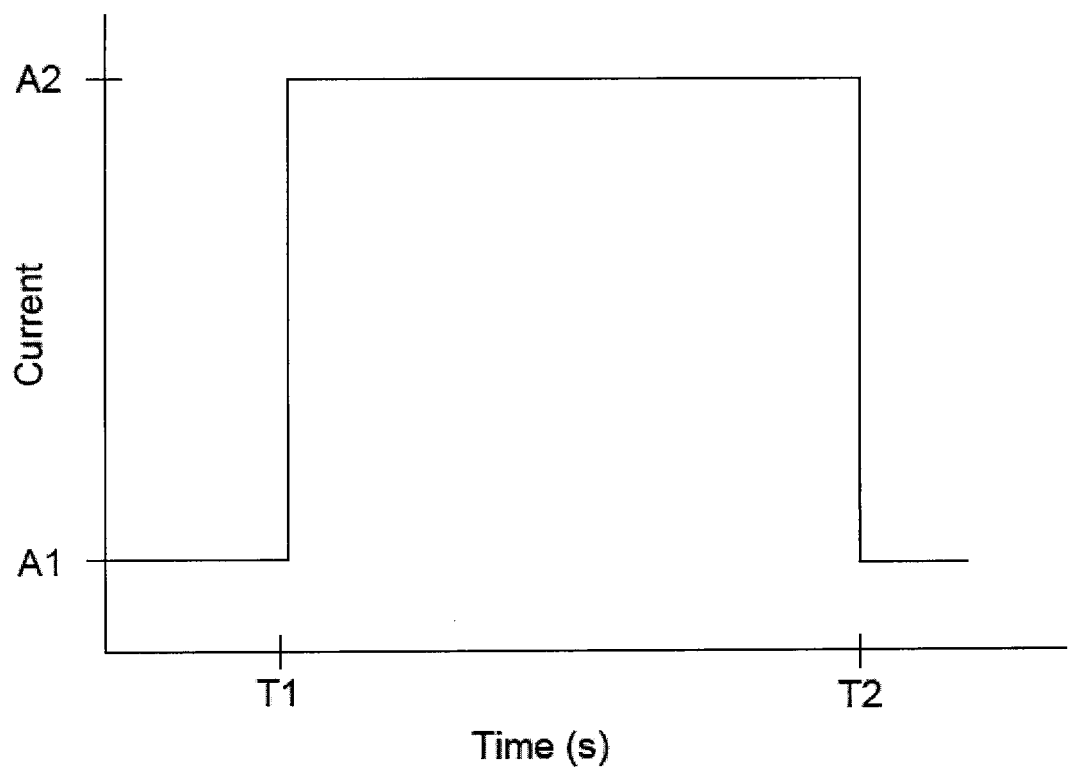
FIG. 4 is an example of an electrical bias waveform having constant current.
Figure 5:
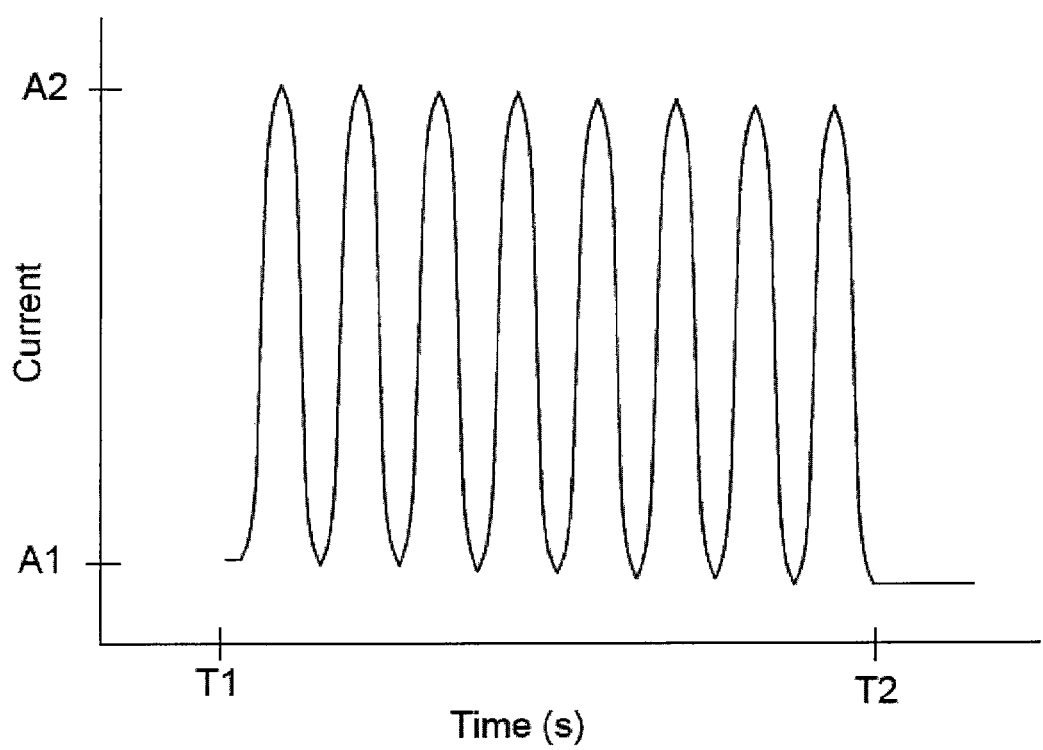
FIG. 5 is an example of an electrical bias waveform having alternating current.

In an exemplary embodiment, when conducting the electrical bias conditioning of a PV module 105, the power source 113 can provide a constant current for a predetermined time from T1 to T2, as illustrated by the graph in FIG. 4. The power source 113 may also be configured to provide a sinusoidal wave of alternating current (between A2 and A1) for a duration (T1-T2 sec.) of time, as shown in FIG. 5. The electrical bias can be applied to the PV module 105 by the biasing tool 115 for a duration ranging up to about 30 minutes (T2-T1 of FIGS. 4 and 5), with between about 1 minute and about 6 minutes being preferred. The temperature of the module 105 may be increasing, decreasing, constant, or a combination thereof while the electrical bias is being applied so long as it is in the preferred temperature range, for example, between about 85° C. and about 160° C., most preferably between about 110° C. and about 160° C.

The electrical bias produced by the power source 113 and biasing tool 115 can include a voltage ranging up to about 600 volts. In a preferred embodiment, the electrical bias has a voltage ranging from about 30 volts to about 200 volts. The electrical bias produced by the power source 113 and biasing tool 115 can also, or alternatively, include a current ranging from about 0.1 amps to about 25 amps. In one embodiment, the produced amperage depends on measured characteristics of the PV module 105 being conditioned, such as the $I_{sc}$ of the PV module 105, which can be assessed by testing equipment, as discussed below, prior to the application of the electrical bias, if desired.

The electrical bias settings are preferably linked to $I_{sc}$ because this allows scaling of the bias set-point with changes in PV module design. The amperage applied by the biasing tool 115 can range from about 0.3 to about 5 times the $I_{sc}$ of the PV module 105. So, if the PV module 105 being conditioned has an $I_{sc}$ of about 1.44 amps, the current supplied to the PV module 105 by the electrical bias may range from about 0.43 amps to about 7.2 amps.

Referring again to FIG. 1, the apparatus 100 may include a temperature sensor 126 located proximate the conveyor means and used to detect PV module 105 temperature. The temperature sensor 126 may be any suitable temperature sensor such as, for example, an infrared temperature sensor or a contact sensor. An infrared temperature sensor is desirable because it can quickly determine the temperature of the PV module 105 without contacting the PV module 105, which is advantageous when the apparatus 100 is incorporated into a fast-paced assembly line. The temperature of the PV module 105 can be assessed in association with the electrical biasing, e.g., prior to or during the biasing, and may influence the parameters of the electrical bias applied to the module 105. As indicated above, at higher temperatures, the biasing time can be shortened. The power source 113 can be controlled, e.g., by the processor 114 (FIG. 3), to provide specific electrical bias to contacts 205, 210 (FIG. 2) of the bias tool 115 in view of module 105 temperature, e.g., when the module 105 is at the preferred temperature the electrical bias can be applied. As a result, the electrical bias may be temperature-corrected in real-time.

The heat source 110 can be configured to increase the temperature of the PV module 105 to a temperature in the preferred range, for example, between about 85° C. and about 160° C., most preferably between about 110° C. and about 160° C. The heat source 110 provides thermal energy to the PV module 105 through any suitable method, prior to or during the electrical biasing. For example, the heat source 110 may include an electric heater, a flame, or any heat source capable of increasing the temperature of the PV module 105 to a suitable temperature. In FIG. 1, the heat source 110 is shown above the PV module 105 and near the location electrical biasing takes place; however, the heat source 110 may be provided in any reasonable proximity to the PV module 105 and biasing tool 115 so as to provide thermal energy to the PV module 105 for the electrical biasing.

As an alternative to the exemplary apparatus 100 shown in FIG. 1, a designated heat source 110 in dedicated association with the biasing tool 115 can be omitted and thermal energy may be provided to the PV module 105 as a result of one or more module 105 manufacturing steps or processes preceding the electrical biasing operation that apply heat to the module 105. For example, applied heat may be a component of a thermal annealing process or a module lamination process that takes place before the PV module 105 reaches the apparatus 100. In such an exemplary lamination process, an interlayer, e.g., 1020 (FIG. 7), within the internal structure of the PV module 105 is softened by heating the PV module 105 to cause the interlayer to bond to other layers within the PV module 105 and provide a protective coating that prevents water intrusion and serves to electrically insulate internal structure of the PV module 105 from the external environment. The lamination process heating can range from about 120° C. to about 180° C. and a duration ranging from about 5 minutes to about 20 minutes, which may provide a suitable PV module 105 temperature for applying the electrical bias with the tool 115.

As another example, heat may be applied to the PV module 105 as part of an annealing process used in manufacturing the PV module 105. During an annealing process, the PV module 105 may be heat treated to alter material properties of one or more layers within the PV module 105. The annealing process may heat the PV module 105 to a temperature between about 85° C. and 160° C., which may provide a suitable PV module 105 temperature for applying the electrical bias with the tool 115.

If the heating process, e.g., lamination or annealing, increases the temperature of the PV module 105 beyond 130° C., sufficient cooling time may be provided before the electrical bias is applied to the PV module 105 by the tool 115. Conversely, if the heating process, e.g., lamination or annealing, does not raise the temperature of the PV module 105 above 85° C., or more preferably 110° C., an additional heating step may be used to achieve a suitable PV module 105 temperature for the electrical biasing.

Referring again to FIG. 1, although the apparatus 100 can be used in and the disclosed method can be conducted in darkness or under ambient light, in an alternative embodiment, the disclosed conditioning also includes subjecting the PV module 105 to light 124 using the light generator 122, which can be provided as part of the apparatus 100. Light biasing has effects similar to electrical biasing and may be used to augment the electrical biasing conditioning. When the application of the electrical bias conditioning is combined with the light energy 124 conditioning, the light energy 124 applied to the PV module 105 can range from 1 to 100 suns.

In a preferred embodiment, the light generator 122 is capable of producing light 124 having an intensity ranging from about 0.01 kW/m$^2$ to about 10 kW/m$^2$. This intensity range includes the solar constant, which is approximately 1.366 kW/m$^2$. The solar constant is the amount of solar electromagnetic radiation per unit area that would be incident on a plane perpendicular to incident solar rays at a distance of one astronomical unit (AU), which is approximately the mean distance from the Sun to the Earth. Therefore, the solar constant is representative of the intensity of solar radiation that a PV module, e.g., 105, will be exposed to on a clear day. The light generator 122 can be monochromatic and optimized for absorption in particular semiconductor layers of the PV module 105. Alternately, the light generator 122 can emit several discrete frequencies of light, a spectrum of light, and/or changing frequencies of light. The light bias may be applied before, during, or after the electrical bias is applied to the PV module 105. It should be noted that this light exposure combined with the electrical biasing and heating is used to condition the module, whereas another, separate light exposure, using the same light generator 122 or another light source, can be used to evaluate the PV module's 105 performance characteristics by exposing the PV module 105 to light and testing the related electrical output, as discussed below.

If testing and evaluation of the PV module 105 performance characteristics in association with or in prelude to the disclosed conditioning is desired, the FIG. 1 apparatus 100 can also include a testing tool 119. The testing tool 119 can include a test circuit 127 connected to a first electrode 121 and a second electrode 123 for connecting with the first and second electrodes 305, 310 of the PV module 105. Alternatively, the biasing tool 115 can be connected to the test circuit 127 and perform the functions of a testing tool in addition to performing the electrical biasing process, thereby making the addition of a separate testing tool 119 unnecessary.

PV module 105 performance testing can be performed before or after conditioning the PV module 105. Such testing may include exposing the PV module 105 to light and measuring photocurrent generated by the module 105. As noted above, to carry out such a performance evaluation, the apparatus 100 may include a designated light source or utilize the light generator 122 provided for conditioning. The testing light source can be mounted proximate to the assembly line. The light source can be capable of producing light having an intensity ranging from about 0.1 kW/m2 to about 10 kW/m2. Accordingly, the light source for testing can be capable of simulating a solar spectrum that is equivalent to about 1 to about 10 suns.

If the testing and evaluation process reveals that the PV module's 105 performance is below a minimum desired level, the non-conforming PV module 105 may be removed from the assembly line or, alternatively, may be returned to the apparatus 100 for additional heat and electrical (and/or light) biasing processing as described above if the performance can be improved by such processing. The evaluation process may also allow conforming PV modules to be grouped according to performance. For example, conforming modules may be subdivided into groups of PV modules having very similar performance characteristics. These groups of PV modules may then be sold as performance-matched sets.

Figure 7:
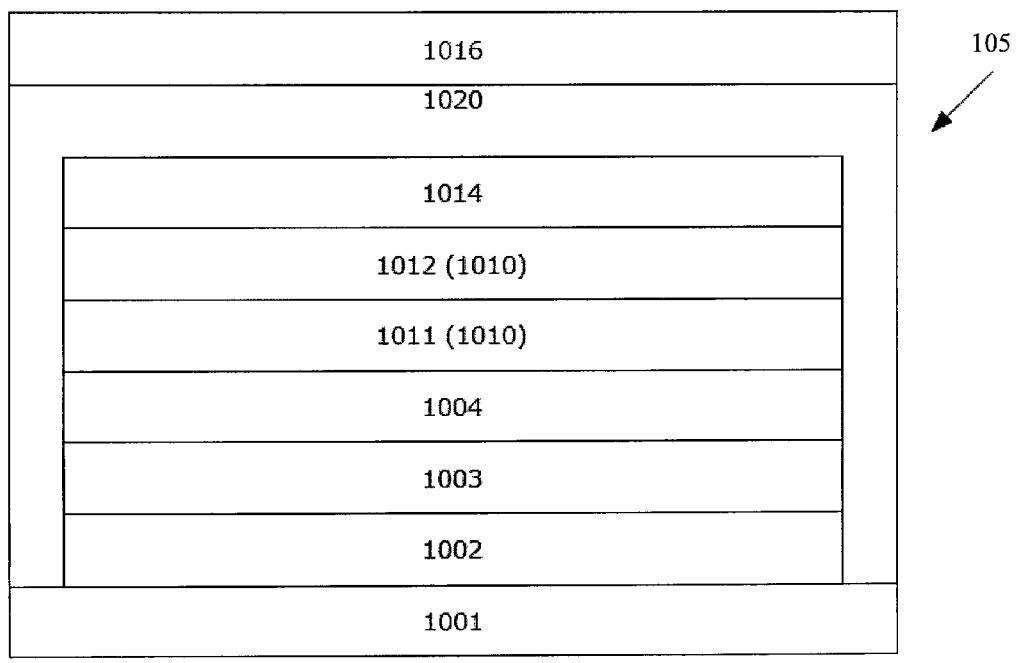
FIG. 7 is a cross-sectional view of an exemplary PV module.

FIG. 7 shows a cross-section of an exemplary PV module 105 that can be used with and manufactured using the disclosed processes. The PV module 105 can include an optically transparent substrate 1001. The substrate 1001 can be any suitable, transparent substrate material such as glass (including, but not limited to soda-lime glass or float glass) or polymer (sheet or plates). A first conductive electrode, e.g., a transparent conductive oxide (TCO) layer 1003 (e.g., indium tin oxide), is provided between the substrate 1001 and a semiconductor layer 1010. The semiconductor layer 1010 can be a bi-layer including a semiconductor window layer 1011 (e.g., cadmium sulfide) and a semiconductor absorber layer 1012 (e.g., cadmium telluride).

A buffer layer 1004 (e.g., a metal-chalcogenide material) can be provided between the TCO layer 1003 and the semiconductor window layer 1011 to provide a smooth surface upon which the semiconductor window layer 1001 may be deposited and also to decrease irregularities that may occur during the formation of the semiconductor window layer 1011. Additionally, a barrier layer 1002 can be incorporated between the substrate 1001 and the TCO layer 1003 to reduce diffusion of sodium or other contaminants from the substrate 1001 to the semiconductor layers, which could result in PV module 105 degradation. The barrier layer 1002 can be, for example, $SiO_2$ or SnO. Together, the buffer layer 1004, TCO layer 1003, and barrier layer 1002 can be considered a TCO stack.

The photovoltaic module 105 can further include a conductive back contact layer 1014 adjacent to the absorber layer 1012, which can serve as a second conductive electrode for the PV module 105, and a back cover 1016 adjacent to the back contact layer, which can serve as a protective layer for the PV module 105. Each layer of the PV module 105 described above may in turn be composed of more than one layer or film. The conductive electrodes, i.e., the TCO layer 1003 and the back contact layer 1014 can be the components within the PV module 105 to which the biasing tool 115 connects, e.g., via conductive leads, for conditioning.

The module 105 can also include an interlayer 1020 between the back cover 1016 and the back contact 1014. The interlayer 1020 may be used to laminate the layers of the module 105 between the back cover layer 1016 and the substrate 1001; thus sealing the layers of the module 105 from the environment. Further, the interlayer 1020 may also be used to bond the front substrate 1001 to the back substrate 1016 through the lamination process. The interlayer 1020 can include any suitable material, such as a polymer.

The interlayer 1020 can be placed in contact with the other layers of the PV module 105 (e.g., back contact 1014, back cover 1016, and substrate 1001) before or after heating the interlayer 1020 with a heat source, e.g., by infrared radiation. Upon heating, the interlayer 1020 and other layers (e.g., back contact 1014, back cover 1016, and substrate 1001) are pressed together, e.g., using a vacuum laminator. The interlayer 1020 material can be melted by the heating and allowed to flow and fill gaps, and then cured to harden. As discussed above, such a heating step can be utilized in the electrical bias conditioning of the PV module 105.

The conditioning steps and apparatus 100 described herein may be expanded to accommodate a plurality of PV modules, e.g., 105, 125 (FIG. 1, 7), in a manufacturing line. For example, instead of applying the electrical bias to one heated PV module 105 at a time, the electrical bias may be applied simultaneously to a plurality of heated PV modules, e.g. 105, 125, that could be heated together. This may be accomplished by introducing additional biasing tools 115 or by adding additional contact pads that allow for rapid interconnection of a plurality of modules. As a result, the time required to manufacture a batch of PV modules (e.g., 105) may be reduced.

Figure 9:
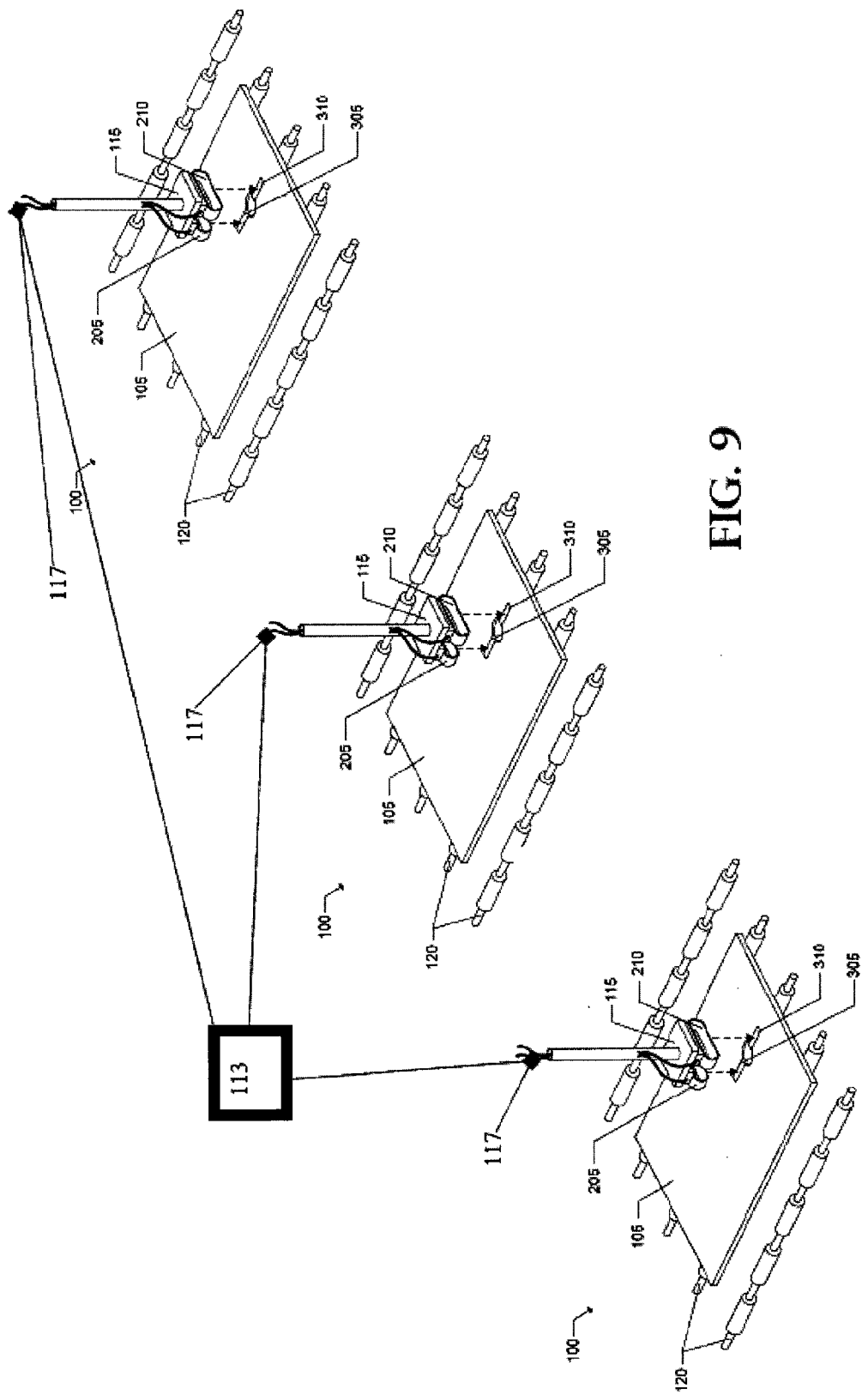
FIG. 9 shows an apparatus for processing multiple PV modules.
Figure 10:
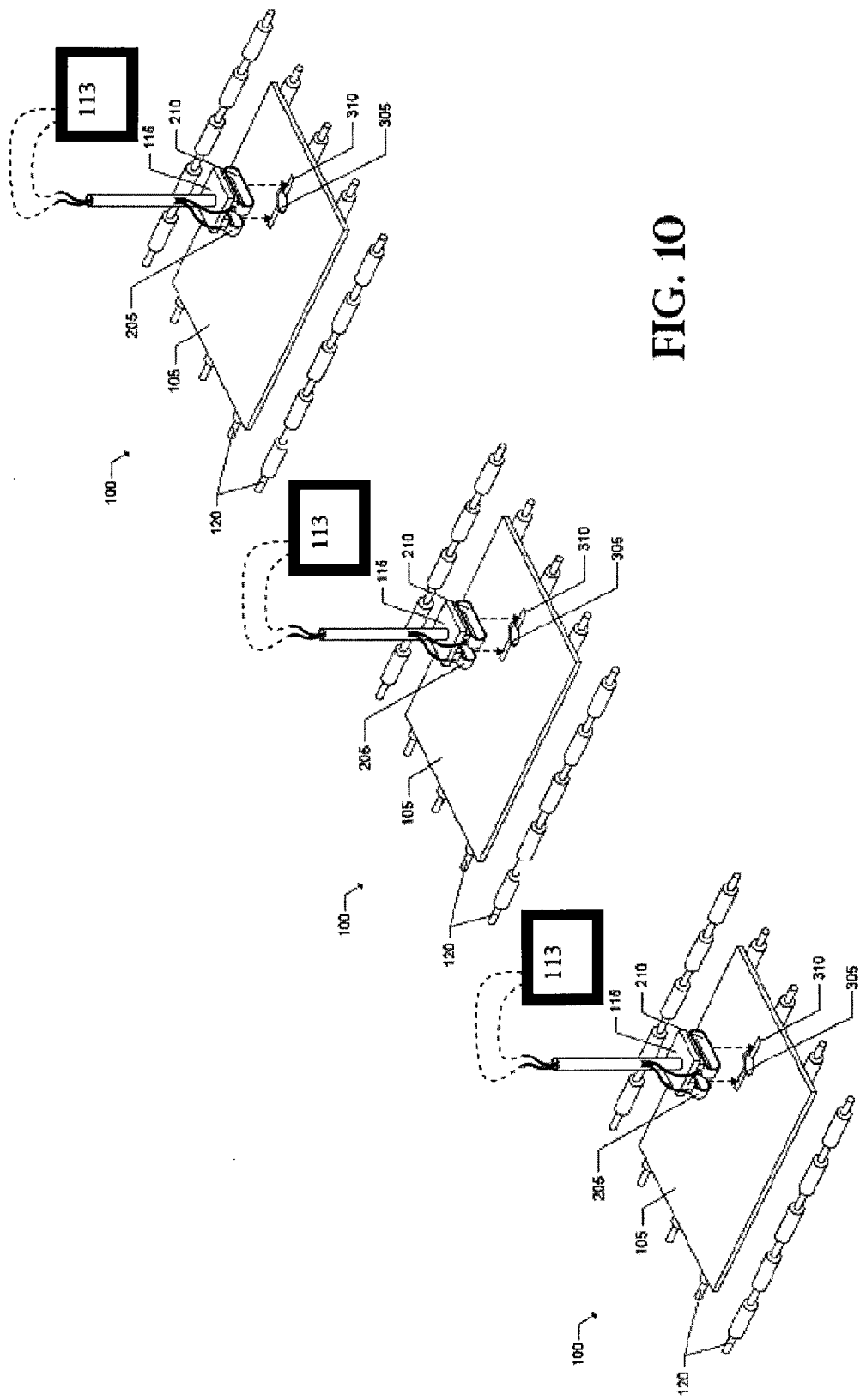
FIG. 10 shows an apparatus for processing multiple PV modules.

As shown in FIG. 10, where a plurality of biasing tools 115 are provided, a dedicated power source 113 may be connected to each respective biasing tool 115 to allow for independent control of bias voltage and current being delivered to each PV module 105. Alternately, as shown in FIG. 9, one power source 113 may be connected to more than one biasing tool 115. For example, for a configuration having five biasing tools 115, three biasing tools 115 may be connected to a first power supply 113 as shown in FIG. 9, and the remaining two biasing tools may be connected to a second power supply 113 (not shown). In this configuration, the same bias voltage and current may be delivered to the three biasing tools 115 connected to the first power supply 113. As a result, independent control over the voltage and current delivered to each PV module 105 may not be possible in this configuration. However, the duration of the electrical bias being delivered can be controlled for each PV module 105 by inserting a relay 117 (FIG. 9) at each biasing tool 115. Each relay 117 allows power delivery to each PV module 105 to be controlled by opening or closing the corresponding relay 117. Therefore, the relays 117 allow each PV module 105 to receive an individual electrical bias duration. Alternately, all relays 117 may open and close in unison, thereby delivering electrical biases having similar durations to all PV modules 105.

Figure 6:
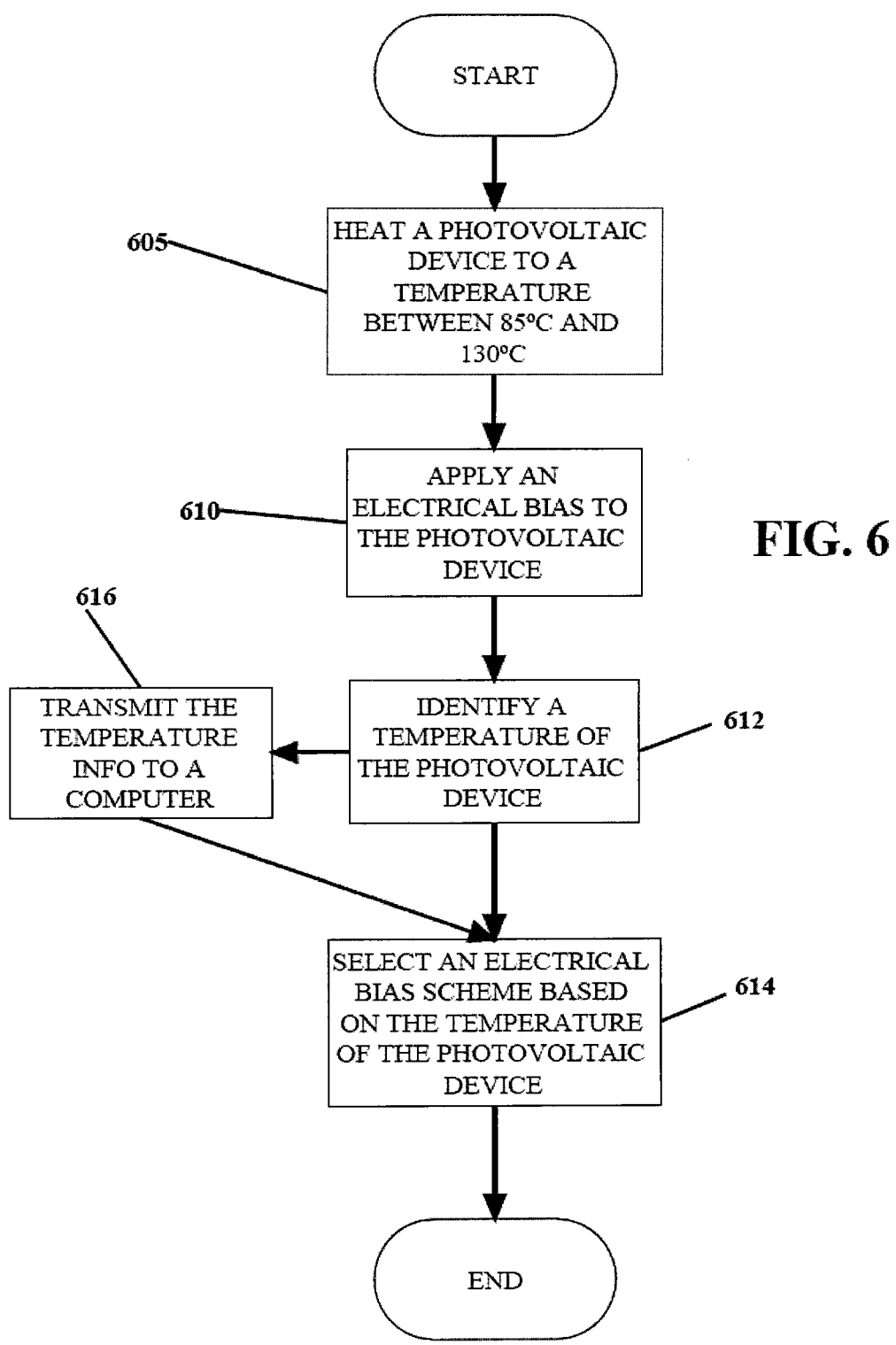
FIG. 6 is a flowchart illustrating a method that can be used to manufacture a PV module.

As shown in FIG. 6, a method for manufacturing a PV module, e.g., 105, may include the following steps: (605) heating a PV module to a temperature between about 85° C. and about 160° C., preferably above about 110° C.; and (610) applying an electrical bias to the PV module. The method may also include the steps of: (612) identifying a temperature of the photovoltaic module; and (614) selecting the electrical bias scheme, e.g., duration, at least in part, on the temperature of the PV module. The method may further include the step of (616) transmitting the temperature of the PV module to a processor and selecting the electrical bias scheme based, at least in part, on the temperature. Identifying the temperature, transmitting the temperature, and selecting the electrical bias scheme may occur in real-time.

Figure 8:
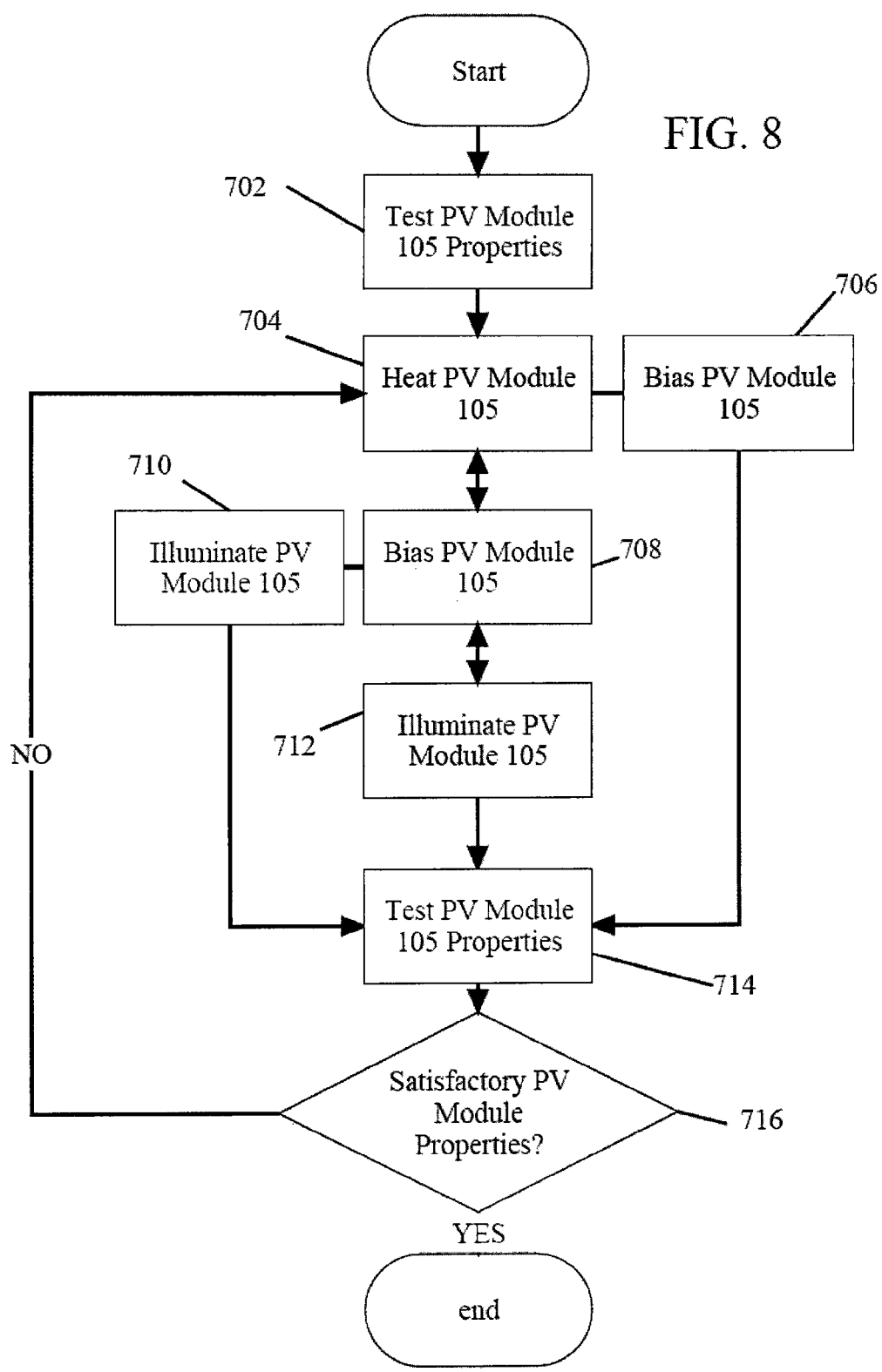
FIG. 8 is a flowchart illustrating a method that can be used to manufacture a PV module.

As shown in FIG. 8, an alternative embodiment for manufacturing a PV module, e.g., 105 includes the step of (702) performing a test on a PV module 105 to determine its performance properties, such as $V_{oc}$, FF, $R_{oc}$, and/or $I_{sc}$. Preferably $I_{sc}$ is determined. If desired, the method may proceed to the step of (704) heating the PV module to within a temperature range of between about 85° C. and 160° C., preferably above 110 C.°. This can be accompanied by the step of (706) simultaneously electrically biasing the PV module. If steps 704 and 706 are not performed simultaneously, an electrical biasing step 708 can follow the heating step 704. This electrical biasing step 708 can be performed with an illumination step 710 of the PV module as described above.

After the completion of these conditioning steps, a testing step 714 can be performed during which the performance properties of the PV module are determined 716 to conclude if the PV module has satisfactory performance properties. If the PV module's properties are determined to be satisfactory, for example, if the $I_{sc}$ is determined to be between about 1.22 A to about 1.33 A (for a First Solar FS Series 2 PV Module) or between about 1.84 A to about 1.98 A (for a First Solar FS Series 3 PV Module), this processing can end. If not, the PV module can be submitted for further similar processing beginning at step 702 or 704.

The embodiments described herein are exemplary and preferred embodiments and should not be considered limiting of the disclosed invention. Other features, objects, and advantages will be apparent from the description, drawings, and claims. Although a number of embodiments of the invention have been described, it will be understood that various modifications may be made without departing from the scope of the invention. Also, it should also be understood that the appended drawings are not necessarily to scale, presenting a somewhat simplified representation of various features and basic principles of the invention. The invention is not to be limited by the disclosure in the specification, but only by the accompanying claims.

What is claimed is:

1. A method for manufacturing a photovoltaic module, comprising:
    heating a photovoltaic module;
    applying an electrical bias to electrodes of the photovoltaic module while the photovoltaic is at an elevated temperature from said heating, wherein the heating and applying an electrical bias are performed in dedicated association with each other; and
    exposing the photovoltaic module to light while applying the electrical bias.

2. The method of claim 1, wherein the photovoltaic module is heated to a temperature between about 85° C. and about 160° C.

3. The method of claim 1, wherein the applying an electrical bias comprises at least one of applying a constant current, applying a constant voltage, applying a variable current, applying a variable voltage, applying a plurality of pulses of constant current, and applying a plurality of pulses of constant voltage.

4. The method of claim 1, wherein the electrical bias is applied for between about 1 minute and about 30 minutes.

5. The method of claim 1, wherein the light has an intensity between 0.1 kW/m2 and 10 kW/m2.

6. The method of claim 1, wherein the applying an electrical bias comprises applying a voltage up to about 600 volts.

7. The method of claim 1, wherein the applying an electrical bias comprises applying a current between about 0.1 amps to about 25 amps.

8. The method of claim 1, wherein the electrical bias is selected based on at least one determined performance characteristic of the photovoltaic module.

9. The method of claim 8, wherein the at least one determined performance characteristic of the photovoltaic module is short circuit current.

10. A method of manufacturing a photovoltaic module, comprising:
    performing a first test of at least one performance characteristic of a photovoltaic module;
    if the at least one performance characteristic of the photovoltaic module is identified to be below a minimum level, processing the photovoltaic module by heating and electrical biasing; and
    performing a second test of the at least one performance characteristic of the photovoltaic module.

11. The method of claim 10, wherein the performing a first test comprises exposing the photovoltaic module to light and measuring photocurrent generated by the module.

12. A method for manufacturing a photovoltaic module, comprising:
    heating a photovoltaic module; and
    applying an electrical bias to electrodes of the photovoltaic module while the photovoltaic is at an elevated temperature from said heating, wherein the heating and applying an electrical bias are performed in dedicated association with each other,
    and wherein the electrical bias is selected based on at least one determined performance characteristic of the photovoltaic module.

* * * * *